Figure 5:
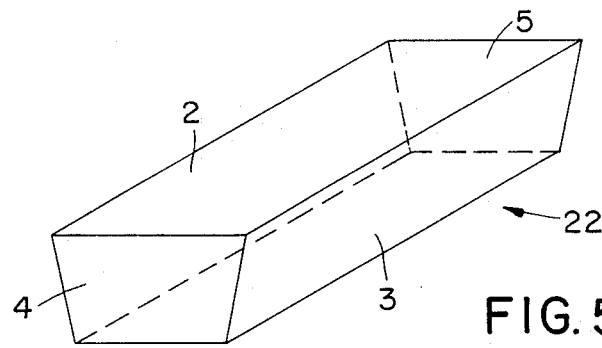

United States Patent [19]

Goetzberger

[11] Patent Number: 4,964,713

[45] Date of Patent: Oct. 23, 1990

[54] CONCENTRATOR ARRANGEMENT

[75] Inventor: Adolf Goetzberger, Merzhausen, Fed. Rep. of Germany

[73] Assignee: Fraunhofer-Gesellschaft zurForderund der Forschung E. V., Munich, Fed. Rep. of Germany

[21] Appl. No.: 392,976

[22] PCT Filed: Nov. 7, 1988

[86] PCT No.: PCT/DE88/00688

§ 371 Date: Jul. 11, 1989

§ 102(e) Date: Jul. 11, 1989

[87] PCT Pub. No.: WO89/05463

PCT Pub. Date: Jun. 15, 1989

[30] Foreign Application Priority Data

Dec. 8, 1987 [DE] Fed. Rep. of Germany ....... 3741477

[51] Int. Cl.[5] ............................................. G02B 17/00
[52] U.S. Cl. .................................... 350/629; 350/630; 136/246
[58] Field of Search ................ 350/629, 630; 126/438, 126/246

[56] References Cited

U.S. PATENT DOCUMENTS

| 3,923,381 | 12/1975 | Winston | 350/630 |
|---|---|---|---|
| 4,029,519 | 6/1977 | Schertz et al. | 136/246 |
| 4,045,246 | 8/1977 | Mlavsky et al. | 136/246 |
| 4,146,408 | 3/1979 | Nelson | 350/629 |
| 4,291,191 | 9/1981 | Dahlberg | 136/246 |
| 4,438,760 | 3/1984 | Radebold | 350/629 |
| 4,538,886 | 9/1985 | Townsend et al. | 350/629 |
| 4,546,757 | 10/1985 | Jakahi | 126/438 |

OTHER PUBLICATIONS

W. T. Welford, R. Winston, "The Optics of Non-Imaging Concentrators" p. 163, 1978, Academic Press, New York.

Primary Examiner—Bruce Y. Arnold
Assistant Examiner—Tho Van Tran
Attorney, Agent, or Firm—Jeffers, Hoffman & Niewyk

[57] ABSTRACT

A concentrator arrangement (10) consists of a plate (11) to which there is coupled a plurality of first stages (14) with parabolic side walls (2, 3) arranged parallel to one another. The first stages (14) are optically coupled with second stages (15) whose coupling surfaces with the first stages (14) and whose coupling surfaces with the solar cells (21) are square. The side walls as well as front and rear walls of the second stages (15) are parabolically curved.

8 Claims, 5 Drawing Sheets

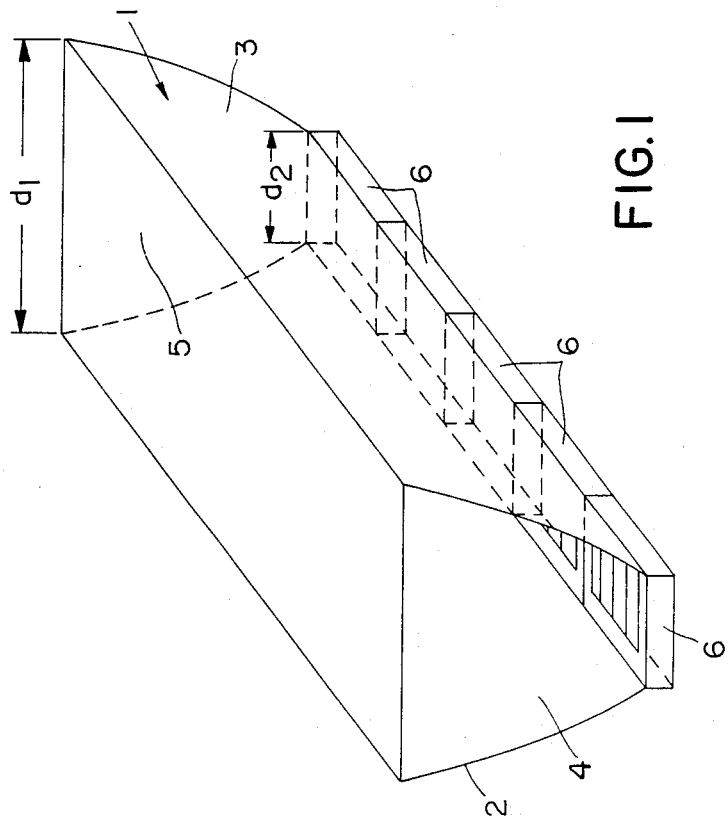

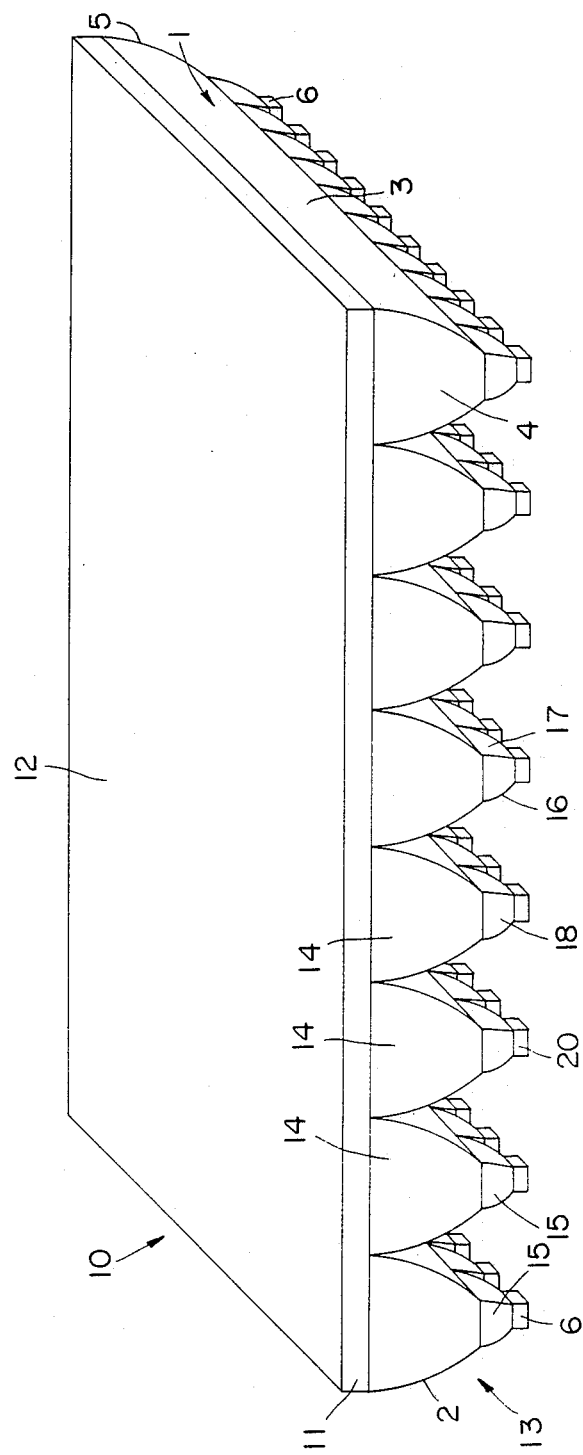

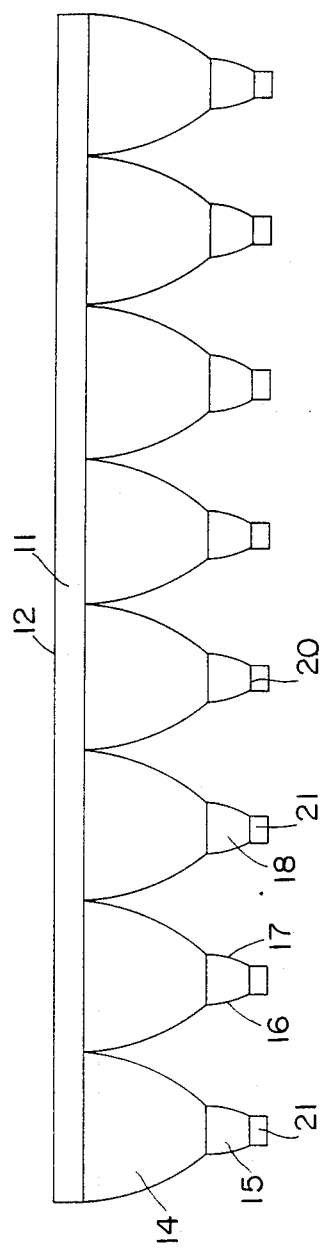
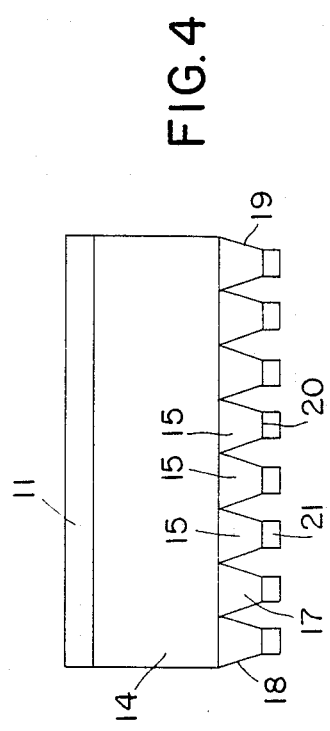

CONCENTRATOR ARRANGEMENT

The invention relates to a concentrator arrangement with a plurality of solar cells and with a plate made of a transparent material with a refractive index of more than 1.45, which presents a flat upper side and an underside which is connected to trough-shaped non-imaging concentrator elements with parabolically curved side walls.

Such concentrator arrangements are known from W. T. Welford, R. Winston "The optics of non-imaging concentrators," Academic Press, New York (1978) and serve as static non-imaging concentrators, in contrast to readjusted concentrators with optically imaging systems, which because of their small acceptance angle have to be aligned relatively accurately upon the sun, but in return carry out a photovoltaic energy transformation without complicated mechanical readjusting arrangements.

Underlying the invention is the problem of creating a concentrator arrangement of the type mentioned at the outset which is distinguished by a higher concentration factor.

This problem is solved according to the invention by the means that the concentrator elements have parabolically curved mirror surfaces facing to the sky.

Advantageous formations and further developments of the invention are the object of subclaims.

In the following, examples of execution of the invention are described in detail with the aid of the drawing.

Figure 6:
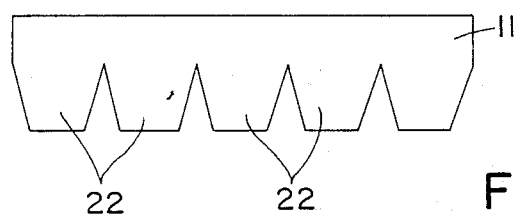
Figure 7:
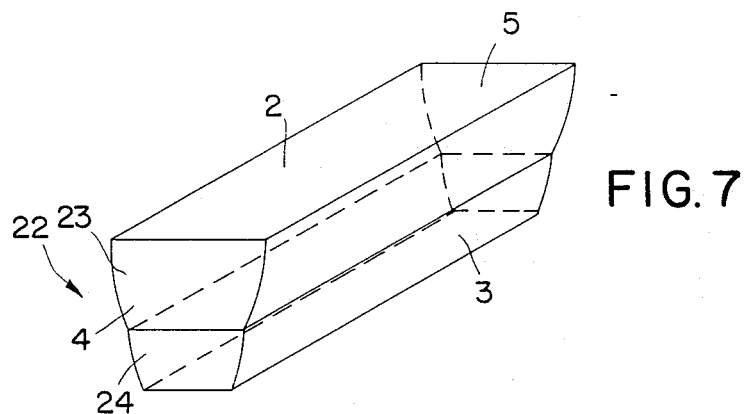

FIG. 1 shows a concentrator of CPC type (compound parabolic concentrator) of known construction type;

FIG. 2: a concentrator arrangement according to the invention with a two-stage concentration, in perspective;

FIG. 3: a view of the concentrator arrangement in east or west direction;

FIG. 4: a side view of the concentrator arrangement in north or south direction;

FIG. 5: a concentrator element for rectangular solar cells;

FIG. 6: a concentrator arrangement with several concentrator elements according to FIG. 5, which are joined with one another by a plate;

FIG. 7: a concentrator element for rectangular solar cells with two successive media of different refractive index, and FIG. 8 various contact geometries for the arrangement of the current-collecting contacts outside of the illuminated surface of the solar cells.

In FIG. 1 there is represented a static concentrator 1 of known construction type, which has the form of a trough and permits a one-dimensional concentration. The static concentrator 1 has a parabolically curved left side wall 2 and a likewise parabolically curved right side wall 3. The side walls 2, 3 have at their upper borders a spacing $d_1$ and approach one another at their lower borders to a spacing $d_2$. In general, the side walls 2, 3 are mirror-coated. The space between the side walls 2, 3 can be filled with glass or plastic with a refractive index $n_2=1.5$, with which it is possible to achieve concentration factors of 2 to 2.2, or the space can also be formed without a refracting medium ($N_2=1$) between the side walls 2, in which case there can only be achieved concentration factors of 1.4 to 1.5.

The static concentrator represented in FIG. 1 is aligned in east-west direction, so that the face sides 4, 5 point to the east and west, respectively, and the side walls 2, 3 point north and south, respectively. There the concentrator 1 is turned about its longitudinal axis running parallel to the side walls 2 in order to achieve an alignment of the concentrator to the south with optimal inclination. This inclination corresponds to the degree of latitude of the place of erection.

The bottom of the static concentrator 1 represented in FIG. 1 is occupied with several solar cells 6 which utilize the direct and diffuse solar light captured by the static concentrator 1 through photovoltaic energy transformation. The concentrator 1 forms a static, non-imaging concentrator of type CPC (Compound Parabolic Concentrator). Such a concentrator is limited in the concentration factor $C=a_1/a_2$ by the Liouville condition $$a_1 \, n_1 \sin \frac{\theta_1}{2} = a_2 \, n_2 \sin \frac{\theta_2}{2},$$

in which $a_1$ is the entry aperture surface, $a_2$ the exit aperture surface, $n_1$ the refractive index of the medium in front of the concentrator, $n_2$ the refractive index of the medium inside the concentrator, $\theta_1$ the aperture angle of the beams at the entry aperture and $\theta_2$ the aperture angle of the radiation at the exit aperture.

In order to receive as much as possible direct solar radiation, a static concentrator must have a large aperture angle which may be smaller in north-south direction than in east-west direction. In north-south direction the reception zone must extend, on the one hand, up to the upper culmination point of the sun, and, on the other hand, into the vicinity of the southern horizon. In collectors or concentrators standing staggered one after another the limitation can lie at the lower culmination point of the sun. In the east-west direction, however, the aperture angle must amount to 180°. These conditions led to the trough form of the static concentrator with one-dimensional concentration represented in FIG. 1, for which the Liouville condition reads:

$$d_1 \, n_1 \sin \frac{\theta_1}{2} = d_2 \, n_2 \sin \frac{\theta_2}{2},$$

in which $d_1$ and $d_2$ signify the above-mentioned spacings of the side walls 2, 3 or the widths of the concentrator 1 at the entry aperture surface and of the exit aperture surface.

FIG. 2 shows a two-stage concentrator arrangement 10 according to the invention, which makes it possible with retention of the aperture angle distribution to achieve a substantially higher static concentration. There, a two-stage concentration is carried out in a refracting medium.

The two-stage concentrator arrangement 10 has at its disposal a plate 11 of transparent material with a refractive index n that is greater than 1.45. The plate 11 is flat on the upper side 12 facing the incident radiation and on the side lying opposite the upper side 12 it is connected optically and mechanically with a structure 13 for the non-imaging concentration of light. The structure 13 brings about a two-stage concentration of the light in linear-unidimensional first stages 14 and two-dimensional second stages 15.

The first stages 14 have the form represented in FIG. 1 of a trough made of glass or plastic. To the exit aperture surfaces of the first stages there are optically and mechanically coupled in each case a large number of second stages 15, which present also parabolically bent side walls 16 and 17 represented in FIG. 3 as well as parabolic front walls 18 and rear walls 19 recognizable in FIG. 4. The lower borders of the side walls 16, 17 and of the front walls 18 as well as of the rear walls 19 end in each case on a bottom surface 20, which is optically coupled with a solar cell 21.

As is yielded from FIGS. 2 to 4, the first stages 14 have rectangular entry apertures and rectangular exit apertures, while the touching second stages 15 present square entry and exit apertures. The second stages 15, therefore, are not exactly radially symmetrical, which leads to a slight loss in concentration. This, however, is expedient, since, on the one hand, the aperture surface can be filled only with square or rectangular structures, and, on the other hand, the solar cells 21 are square.

The Liouville condition is optimally exhausted when $\theta = 180°$. In the linear trough concentrator with a refracting medium whose refractive index is greater than 1 this is achieved only in the north-south direction, but not in the east-west direction. According to the law of refraction in air horizontal beams after entry into the medium have a divergence $\theta'$, which is given by $$\sin \theta'/2 = 1/n.$$

By a two-dimensional concentration this divergence can be increased to 90°. In the two-stage concentrator arrangement 10 according to the invention this is achieved by the means that in the linear first stages 14 the north-south beams are brought to the same divergence as the east-west beams (by analysis into vertical components this observation holds also for all obliquely incident rays).

The dimensions $d_1$ and $d_2$ of the first linear parabolic stage 14 are give, therefore, by $$d_1 \sin \theta/2 = d_2 \, n \sin \theta'/2,$$

in which $\theta$ is the north-south entry angle determined by the above-indicated conditions. There is yielded, therefore, $$d_1/d_2 = C_1 = 1/\sin \theta/2.$$

ps Since the radiation is now axially symmetrical, it is two-dimensionally further concentrated in the second stages 15 to $\theta = 180°$.

There holds the following:

$$A_1 \, n \sin^2 \theta'/2 = A_2 \sin^2 \pi/$$

$$A_1/A_2 = C_2 = \frac{1}{\sin^2 \theta'/2} = n^2$$

where $A_1$ and $A_2$ are the entry and exit aperture surfaces(areas) allocated to the second stages 15.

$$C_1 \times C_2 = \frac{n^2}{\sin \theta/2}$$

If one compares this with the conventional one-stage concentration of $$\frac{d_1}{d_2} = \frac{n}{\sin \theta_1/2},$$

one perceives that a factor n is gained.

The second stages 15 can consist of a transparent material with a refractive index $n_2$ which is greater than the refractive index $n_1$ of the transparent material of the first stages 14. This is significant because for this little material is consumed and materials with a relatively high refractive index are mostly expensive. In this case the condition for the second stages 15 is $$A_1 \, n_1^2 \sin^2 \theta^2/2 = A_2 \, n_2^2;$$

$$\frac{A_1}{A_2} = n_2^2.$$

The full concentration is then $n_2^2/(\sin \theta/2)$, therefore as if the entire concentrator arrangement 10 consisted of the material with the refractive index $n_2$.

In the concentrator arrangement 10 described only the relative dimensions enter into the concentration. For this reason very flat structures can be realized with relatively low consumption of material. This requires small solar cells 21 which must be correspondingly accurately positioned. This is possible with the aid of the processes developed in semiconductor technology.

In the following table there are cited quantitative examples for $\theta/2 = 23.5°$.

| | | |
|---|---|---|
| Linear trough concentrator | $n = 1.5$ | $C_{max} = 3.76$ |
| Two-stage concentrator | $n_1 = n_2 = 1.5$ | $C_{max} = 5.64$ |
| Two-stage concentrator | $n_1 = 1.5; n_2 = 1.8$ | $C_{max} = 8.13$ |
| Two-stage concentrator | $n_1 = 1.5; n_2 = 2$ | $C_{max} = 10.03$ |

As compared with the execution according to FIG. 1 with a concentration factor of 3.76 there are achieved with the concentrator arrangement 10, depending on the refractive index of the first stages 14 and second stages 15, clearly higher concentration factors between 5.64 and 10.03.

The aperture angle $\theta_1$ of the first stages 14 is chosen in such a way that on alignment of the concentrator arrangement 10 to the south with optimal inclination the location of the sun at its highest altitude still falls in the acceptance range, and the other limit of the aperture angle contains at least the minimal culmination point of the sun. The linear concentration factor $C_1$ of the first stages 14 is chosen in such a way aperture angle of the rays projected onto the north-south direction fulfills on the exit surface the condition $C_1 = 1/(\sin \theta_1/2)$.

In a concentrator arrangement 10 that consists of a homogeneous medium with the refractive index n, the concentration factor $C_2$ of the second two-dimensional stage 15 is chosen in such a way that there holds $C_2 = n^2$.

It is especially advantageous if the first stages 14 are made of a material with a refractive index $n_1$ and the second stages 15 are made of another material with a refractive index $n_2$ that is greater than the refractive index $n_1$. In such a case it is possible to achieve the result that the concentration of the second stages is $C_2 = n_2^2$.

In one example of execution of the invention the plate 11 is rectangular and has a flat front side. On the back there are present many juxtaposed linear structures of the first stage 14 on the exit openings of which there are present touching elements of the second stages 15.

The plate 11, the first stages 14 and the second stages 15, especially if they are made of a material with the same refractive index, can be made in one piece. If different materials are used, the individual stages 14, 15 are joined with one another in such a way that there results as good as possible an optical coupling. There, in a transition zone, there can also be provided a gradual change of the refractive index in order to avoid reflections.

The above-described structure with two-stage concentrations presents the best solution optically. It has, however, a certain structural height which is associated with an expenditure of material. A one-stage version is shorter, even if optically less effective. This version concentrates more strongly in the north-south direction than in the east-west direction and requires, therefore, rectangular instead of square solar cells 21. FIG. 5 shows an individual concentrator for a one-stage version whose face sides 4 and 5, like the front walls 18 and 19 of the second stages 15, are parabolically curved.

According to the principles already set forth, the dimensions according to FIG. 5 are as follows:

linear north-south concentration $$C_{NS} = \frac{a_1}{a_2} = \frac{n}{\sin \theta_1/2}$$

with $\theta$ = entry aperture angle, n = refractive index linear east-west concentration $$C_{EW} = \frac{b_1}{b_2} = n.$$

total concentration $\frac{a_1 b_1}{a_2 b_2} = \frac{n^2}{\sin \theta_1/2}$.

These structures can, as described above, be joined with a continuous plate 11, which is illustrate in FIG. 6 and changes nothing in the optical relations.

Also the rectangular concentrators 22 in contrast to the square second stages 15, as is illustrated in FIG. 7, can be realized with two materials 23, 24, whose refractive indices are $n_1$ and $n_2$. The face surfaces 4, 5 of the concentrator 22 represented in FIG. 7, like the front walls 18 and rear walls 19 of the second stage 15 are parabolically curved. The additional concentration is then $$\frac{a_2}{a_3} = \frac{b_2}{b_3} = \frac{n_2}{n_1} ; \text{i.e.} \frac{a_1}{a_3} =$$

$$\frac{n_2}{\sin \theta_1/2} ; \frac{b_1}{b_3} = n_2.$$

These equations contain the dimensioning specifications for the lengths of the concentrator 22, in which $a_1$ $a_2$ and $a_3$ signify the dimensions in north-south direction and $b_1$, $b_2$ and $b_3$ the dimensions in east-west direction on the entry aperture of the concentrator 22, at the transition to the second material 24 and at the exit aperture.

Figure 8A:
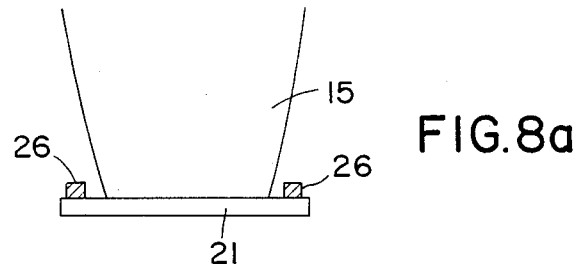
Figure 8B:
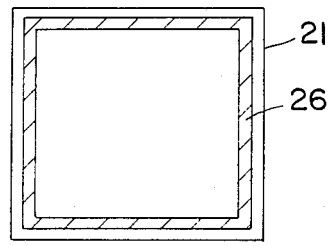
Figure 8C:
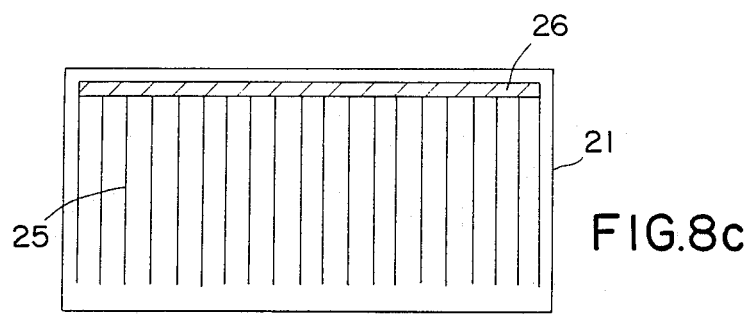

In FIGS. 8a, 8b and 8c there are represented contact geometries for the solar cells 21 in connection with the exit apertures of the concentrator arrangement 10. Since the metal contacts of the solar cells 21 screen out the radiation, they cause losses. For this reason the contact grid surfaces are kept as small as possible. Static concentrators of the above-described type offer the possibility of minimizing the screening out by the lead-off grid 25 of the solar cells 21 by the means that the current-collecting contacts 26 (bus bars) are arranged outside the illuminated surfaces of the solar cells 21, as is illustrated in FIG. 8. FIG. 8a shows there the course of the current collecting bar 26 outside the circumference of the lower end of a second stage 15. FIG. 8b shows a plan view of the solar cell 21 in front of the fastening to the second stage 15. FIG. 8c shows a possibility of formation in a rectangular solar cell 21, which is used together with a concentrator 22.

I claim:

1. A concentrator arrangement comprising a plurality of solar cells, a plate made of a transparent material with a refractive index of more than 1.45, which plate has a flat upper side and an underside which is connected to trough-shaped non-imaging concentrator elements having parabolically curved side walls, wherein the concentrator elements present parabolically curved mirror surfaces facing the sky.

2. A concentrator arrangement according to claim 1, wherein the parabolically curved mirror surfaces are constructed on concentrator elements which are rectangular in plan view.

3. A concentrator arrangement according to claim 1, wherein the parabolically curved mirror surfaces are constructed on concentrator elements which are square in plan view.

4. A concentrator arrangement according to claim 3, wherein the concentrator elements which are square in plan view are optically coupled as second stages with linear unidimensional concentrator elements serving as first stages.

5. A concentrator arrangement according to claim 2, wherein the concentrator elements which are rectangular in plan view are provided with parabolically curved side walls in the direction of light incidence, said elements consisting of two materials with different refractive indices.

6. A concentrator arrangement according to claim 4, wherein the second stages consist of a material having a different refractive index than that of the material of the first stage.

7. A concentrator arrangement according to claim 5 or 6, wherein the material adjacent to the solar cells presents the higher refractive index.

8. A concentrator arrangement according to claim 4, wherein the second stages are arranged in mutual direct contact in the longitudinal direction of the first linear-unidimensional stages.

* * * * *